US006303877B2

United States Patent
Moriizumi et al.

(10) Patent No.: US 6,303,877 B2
(45) Date of Patent: *Oct. 16, 2001

(54) MULTILAYER THIN-FILM WIRING BOARD

(75) Inventors: Kiyokazu Moriizumi; Shunichi Kikuchi; Naomi Fukunaga, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/109,912

(22) Filed: Jul. 2, 1998

(30) Foreign Application Priority Data

Dec. 26, 1997 (JP) .................................................. 9-361166

(51) Int. Cl.[7] ...................................................... H01R 9/09
(52) U.S. Cl. ......................... 174/261; 174/255; 257/698; 361/760; 361/803
(58) Field of Search ................................. 174/255, 260, 174/264, 261; 257/698; 361/760, 780, 795, 803

(56) References Cited

U.S. PATENT DOCUMENTS 5,422,514  * 6/1995 Griswold et al. ..................... 257/679

FOREIGN PATENT DOCUMENTS

| 60-154496 | 8/1985 | (JP) . |
|---|---|---|
| 61-106079 | 7/1986 | (JP) . |
| 3-286590 | 12/1991 | (JP) . |
| 4-23495 * | 1/1992 | (JP) . |
| 5-183271 | 7/1993 | (JP) . |
| 7-231172 * | 8/1995 | (JP) . |

* cited by examiner

Primary Examiner—Albert W. Paladini
(74) Attorney, Agent, or Firm—Armstrong, Westerman, Hattori, McLeland & Naughton, LLP

(57) ABSTRACT

A multilayer thin-film wiring board including a base material provided with a plurality of wiring layers and an insulating layer laminated on the base material, and including a via formed by laminating the wiring layers so as to be provide through the insulating layer. A plurality of branching vias are provided by forming a plurality of branches in one of the wiring layers forming the via, the plurality of branching vias being placed along a direction of extension of the base material. The plurality of branching vias are joined to the one of the plurality of wiring layers which is placed at a position closest to the base material.

4 Claims, 3 Drawing Sheets

MULTILAYER THIN-FILM WIRING BOARD

BACKGROUND OF THE INVENTION

1. Field of the Invention

The present invention generally relates to a multilayer thin-film wiring board, and particularly relates to a multilayer thin-film wiring board provided with a via for interlayer connection.

2. Description of the Related Art

Recently, multilayer thin-film wiring boards, which can provide a high-density wiring, are coming into actual use. Such a multilayer thin-film wiring board may be a so-called MCM (Multi-Chip-Module) board, which may be applied to an electronic device such as a computer. The multilayer thin-film wiring board is formed such that insulating layers and wiring layers are laminated.

A very thin insulating layer, usually formed of polyimide, maybe formed using a spin-coat technique. A wiring board having a high-density pattern may be formed by sputtering and by etching using a high-sensitivity resist.

The multilayer thin-film wiring board has a structure such that terminals (signal, power supply and ground) of electronic components such as LSI chips mounted on the surface of the board and input/output pins are respectively connected to their intended layers through a via, so as to enable a wiring and a power supply between components.

Recently, flip-chip mounting using solder bumps is widely employed, in order to deal with an increasing number of terminals resulting from LSI chips having ever higher densities. Further, heat dissipation from LSI chips mounted on the multilayer thin-film wiring board is increasing. Therefore, there is a need for a multilayer thin-film wiring board which can be used with an LSI chip having a greater number of terminals and which has good heat dissipation characteristics.

FIG. 1 is an enlarged cross-sectional diagram showing an interlayer connection via 20 provided in a multilayer thin-film wiring board 2 of the related art.

As shown in FIG. 1, the multilayer thin-film wiring board 2 includes a ceramic base 4, first to sixth wiring layers 6, 8, 10, 12, 14 and 16 (respectively), an interlayer insulating layer 18 and an interlayer connection via 20. FIG. 1 shows an example where a solder bump 22 is joined to an upper part of the interlayer connection via 20.

The first to sixth wiring layers 6, 8, 10, 12, 14 and 16 are laminated on the ceramic base 4 such that the layers 6, 8, 10, 12, 14 and 16, are separated by the interlayer insulating layer 18. The first wiring layer 6 is a ground layer, the second wiring layer 8 is a power supply layer, the third, forth and fifth wiring layers 10, 12 and 14, respectively are signal layers, and the sixth wiring layer 16 is a surface layer. Each of those wiring layers 6, 8, 10, 12, 14 and 16 is insulated from each other by being laminated together with the interlayer insulating layer 18.

The interlayer insulating layer 18 is not provided at a position where the interlayer connection via 20 is formed. Therefore, the wiring layers 6, 8, 10, 12, 14 and 16 will be directly laminated, or, the first wiring layer 6 and the sixth wiring layer 16 will be electrically connected by the interlayer connection via 20.

In the example shown in FIG. 1, the solder bump 22 is connected to the upper part of the sixth wiring layer 16. This solder bump 22 acts as, for example, an external connection terminal of an LSI chip (not shown). Thus, the solder bump 22 will be electrically connected to the first wiring layer 6 by the interlayer connection via 20. Thereby, the LSI chip and the multilayer thin-film wiring base 2 will be electrically connected.

Now, a mechanical strength of the interlayer connection via 20 which is provided in the above-described multilayer thin-film wiring board 2 will be described. The interlayer connection via 20 has a structure such that each of the wiring layers 6, 8, 10, 12, 14 and 16 are directly laminated as described above. At the lower-most part of the interlayer connection via 20, the first wiring layer 6 is provided on the ceramic base 4 such that the total area of the first wiring layer 6 is in contact with the ceramic base 4. The second to fifth wiring layers 8, 10, 12, 14 and 16, each having a predetermined diameter, are laminated on the first wiring layer 6.

With the above-described structure, a difference in thermal expansion rates between the LSI chip and the ceramic base 4 may occur when heat is applied to the multilayer thin-film wiring board 2, for example, upon mounting. The difference in thermal expansion rates is applied as a stress to the interlayer connection via 20 formed between the LSI chip and the ceramic base 4.

As shown in the figure, the interlayer connection via 20 is supported by the interlayer insulating layer 18 which is formed of a flexible resin such as polyimide. A stress resulting from the difference in thermal expansion rates causes the interlayer connection via 20 to be displaced along the surface of the ceramic base 4 (arrow X) with a flexible deformation of the interlayer insulating layer 18.

The first wiring layer 6 positioned at the lower-most part of the interlayer connection via 20 is in full contact with the rigid ceramic base 4. Therefore, the first wiring layer 6 and the ceramic base 4 are positively joined with a greater mechanical strength. However, since the second wiring layer 8 forming the interlayer connection via 20 has a relatively small diameter, the above-described stress will concentrate on a position joining the second wiring layer 8 and the first wiring layer 6 (i.e., an area encircled by a dashed line indicated by an arrow A, in FIG. 1). In the worst case, the second wiring layer 8 may peel off from the first wiring layer 6, resulting in a disconnection. Accordingly, there is a need for a multilayer thin-film wiring board which has a sufficient reliability.

SUMMARY OF THE INVENTION

Accordingly, it is a general object of the present invention to provide a multilayer thin-film wiring board which can satisfy the needs described above.

It is another and more specific object of the present invention to provide a multilayer thin-film wiring board which can achieve an improved reliability by preventing a disconnection of a via.

In order to achieve the above objects, a multilayer thin-film wiring board includes a plurality of branching vias provided by forming a plurality of branches in at least one of the wiring layers forming a via, the plurality of branching vias being placed along a direction of extension of the base material. The plurality of branching vias are joined to one of the plurality of wiring layers which is placed at a position closest to the base material.

In the multilayer thin-film wiring board described above, stress applied to the via is dispersed in the plurality of branching vias. Accordingly, stress applied to the via and branching vias respectively will be reduced and the via and branching vias are prevented from peeling off.

It is still another object of the present invention to provide a multilayer thin-film wiring board which can prevent the branching vias from disturbing other ones of the plurality of wiring layers, so that the plurality of wiring layers may be positioned in any order.

In order to achieve the above object, the plurality of branching vias are formed on one of the plurality of wiring layers placed at a position closer to the base material compared to a signal wiring layer of the plurality of wiring layers.

It is yet another object of the present invention to provide a multilayer thin-film wiring board which can, in a case where an element (e.g., a semiconductor chip) joined to the via produces heat, dissipate the thus-produced heat by the via and the branching vias, thus improving a heat dissipation efficiency.

In order to achieve the above object, the via is, along with the plurality of branching vias, joined to one of the plurality of the wiring layers which is placed at a position closest to the base material.

It is yet another object of the present invention to provide a multilayer thin-film wiring board which can provide a sufficient strength against stress resulting from a difference in thermal expansion rates between the semiconductor chip and ceramic base and against stress holding the base material together with the mounting board.

In order to achieve the above object, the via is joined to an external connection terminal at an end part which is opposite to the base material.

Other objects and further features of the present invention will be apparent from the following detailed description when read in conjunction with the accompanying drawings.

DETAILED DESCRIPTION OF THE PREFERRED EMBODIMENTS

In the following, a principle and an embodiment of the present invention will be described with reference to the accompanying drawings.

Figure 2:
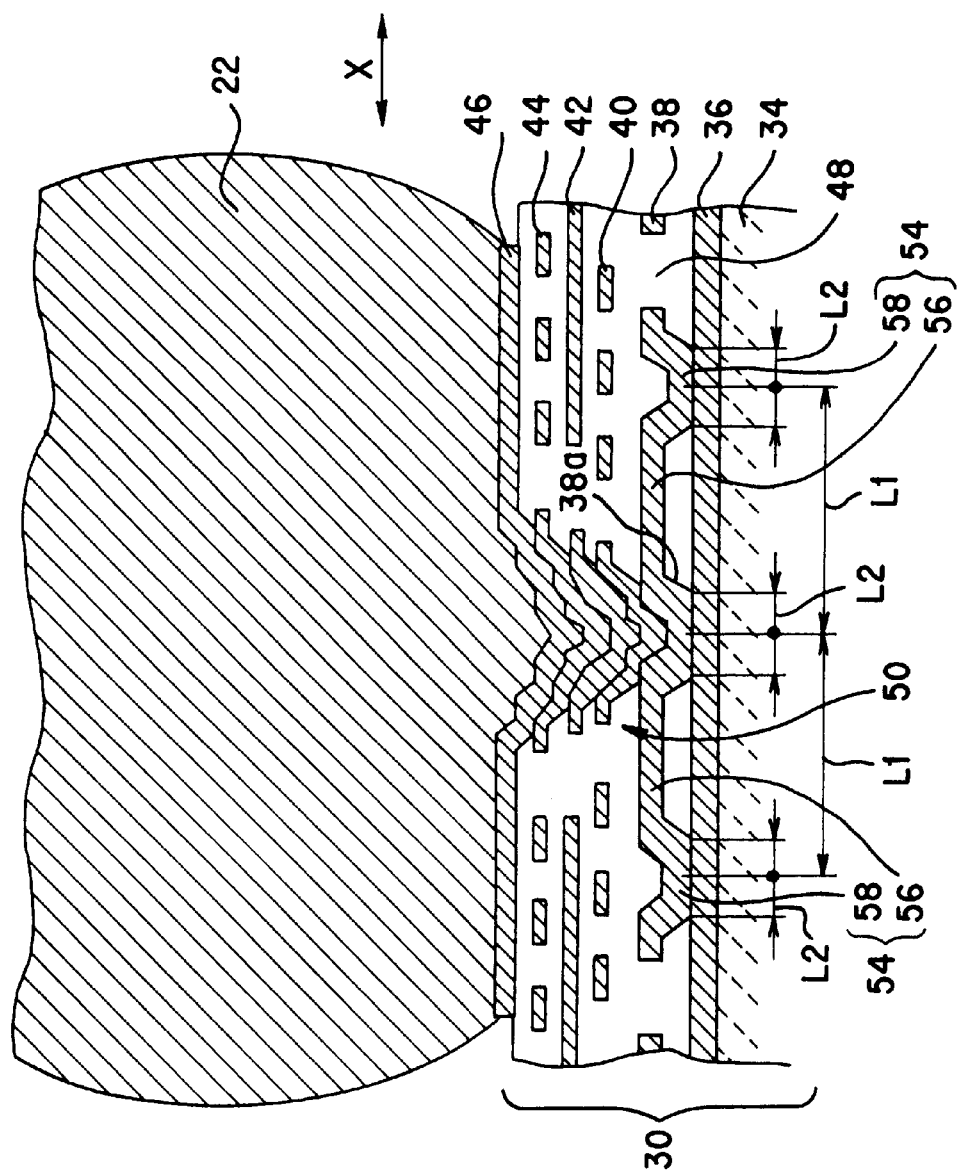
FIG. 2 is an enlarged cross-sectional diagram showing an interlayer connection via provided in a multilayer thin-film wiring board according to an embodiment of the present invention.
Figure 3:
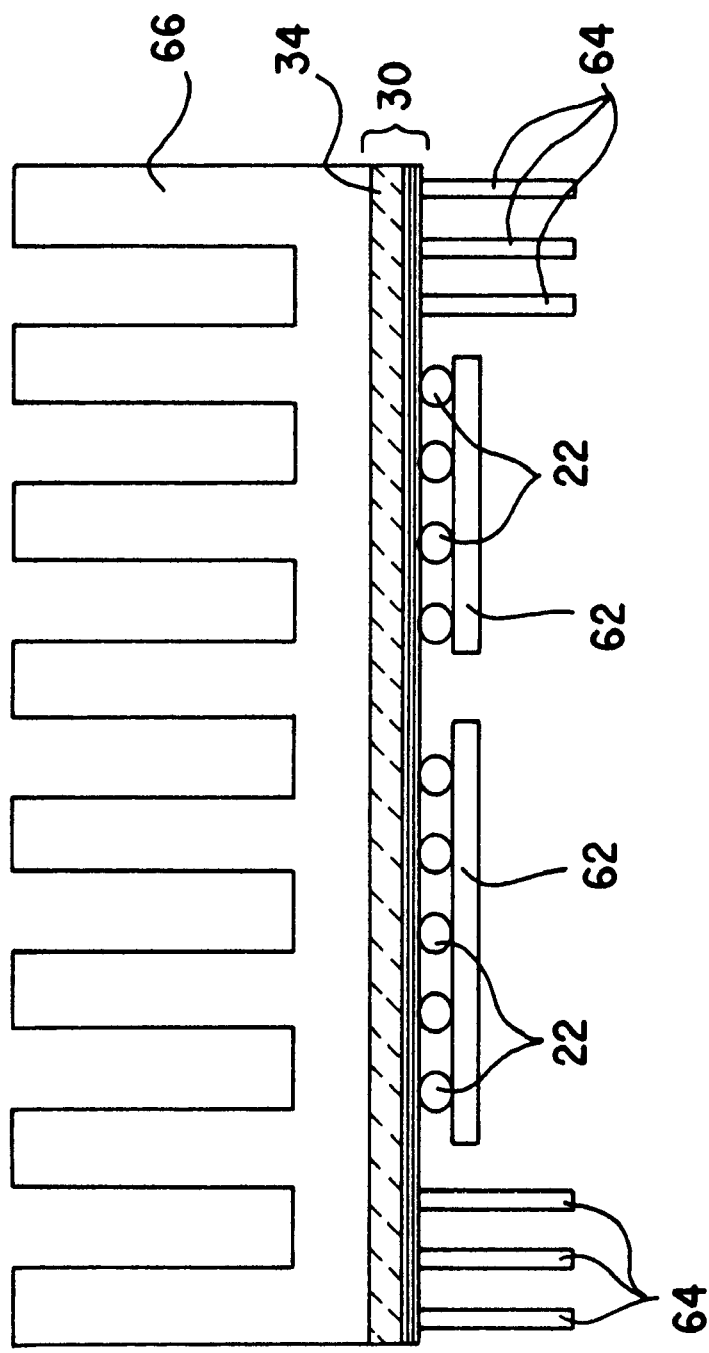
FIG. 3 is a diagram showing a MCM (Multi-Chip-Module) using a multilayer thin-film wiring board according to an embodiment of the present invention.

FIG. 2 is an enlarged cross-sectional diagram showing an interlayer connection via 50 in a multilayer thin-film wiring board 30 according to an embodiment of the present invention. FIG. 3 is a diagram showing a Multi-Chip-Module (MCM) 60 using a multilayer thin-film wiring board 30 according to an embodiment of the present invention.

First, referring to FIG. 3, an example of an application of the multilayer thin-film wiring board 30 will be described. The MCM 60 generally includes the multilayer thin-film wiring board 30, semiconductor chips 62, input/output pins 64 and a cooling fin 66.

As will be described later, the multilayer thin-film wiring board 30 is constructed such that first to sixth wiring layers 36, 38, 40, 42, 44 and 46 are formed on a ceramic base (base material) 34. The multilayer thin-film wiring board 30 is provided with a plurality of semiconductor chips 62 joined thereto by solder bumps 22 and a plurality of the input/output pins 64 standing thereon.

Also, the cooling fin 66 is provided on the multilayer thin-film wiring board 30 at the side whereon the ceramic base 34 is provided. The cooling fin 66 is formed of a high thermal conductivity material such as aluminum, and has a plurality of recessed and raised parts so as to improve the heat dissipation characteristics by increasing an area in contact with air. The cooling fin 66 is for example attached to the ceramic base 34 using an adhesive agent having high thermal conductivity.

In the MCM 60 of the above-described structure, the multilayer thin-film wiring board 30 electrically connects the input/output pins 64 and the semiconductor chips 62, so as to act as an interface between the semiconductor chips 62 and external parts for exchanging signals and as a power supply to the semiconductor chips 62. Also, the multilayer thin-film wiring board 30 may have a reduced thickness compared to a multilayer ceramic board or a multilayer printed wiring board. Thus, the MCM 60 may be miniaturized by using the multilayer thin-film wiring board 30.

Next, referring to FIG. 2, the structure of the multilayer thin-film wiring board 30 will be described. The multilayer thin-film wiring board 30 includes the ceramic base 34, the first to sixth wiring layers 36, 38, 40, 42, 44 and 46 (respectively), an interlayer insulating layer 48, an interlayer connection via 50 and a plurality of branching vias 54.

The ceramic base 34 has a thin planar shape and is used as a base material when forming the first to sixth wiring layers 36, 38, 40, 42, 44 and 46 and the interlayer insulating layer 48. The above-described heat dissipation (cooling) fin 66 is provided on the side of the ceramic base 34 opposite to the side whereon the first to sixth wiring layers 36, 38, 40, 42, 44 and 46 and the interlayer insulating layer 48 are formed.

The first to sixth wiring layers 36, 38, 40, 42, 44 and 46 are formed of, for example, copper (Cu) and are laminated on the ceramic base 34 with the interlayer insulating layer 48. The interlayer insulating layer 48 is formed of an insulating resin, such as polyimide. The first to sixth wiring layers 36, 38, 40, 42, 44 and 46 may be formed by a well-known photolithography technique, which will be described below.

First, a copper layer is formed on the ceramic base 34 by employing a thin-film forming technique (e.g., sputtering), and a photoresist is coated on top of the copper layer. Subsequently, the photoresist is removed at positions corresponding to positions where the copper layer is to be removed. This is achieved by implementing exposure and processing against the photoresist. Then, the first wiring layer 36 of the predetermined pattern is formed by removing unnecessary copper by etching and by removing photoresist.

Next, a photosensitive polyimide resin is coated on the ceramic base 34 whereon the first wiring layer 36 is formed. The interlayer insulating layer 48 is formed only at a predetermined position by exposing and subsequently processing the photo-sensitive polyimide resin at the predetermined position. The wiring layers 38, 40, 42, 44 and 46 and the interlayer insulating layer 48 are formed by repeatedly implementing the above processes. Thus, the multilayer thin-film wiring board 30 is formed.

In the present embodiment, the first wiring layer 36 is a ground layer, the second wiring layer 38 is a power supply layer, the third, forth and fifth wiring layers 40, 42 and 44, respectively, are signal layers, and the sixth wiring layer 46 is a surface layer. As described above, the wiring layers 36, 38, 40, 42, 44 and 46 are laminated with the interlayer insulating layer 48. Therefore, the wiring layers 36, 38, 40, 42, 44 and 46 are insulated from each other except at those positions where the interlayer insulation layer 48 is not formed.

In the following, the interlayer connection via 50 will be described. The interlayer connection via 50 is formed through the interlayer insulating layer 48 for electrically connecting the sixth wiring layer 46 whereon the solder bump 22 is formed and the first wiring layer 36.

In detail, the interlayer insulating layer 48 is not provided at the position where the interlayer connection via 50 is formed. Therefore, as shown in the figure, each layer 36, 38, 40, 42, 44 and 46 will be directly laminated. In other words, the structure will be such that the first wiring layer 36 and the sixth wiring layer 46 are connected.

As shown in FIG. 3, the solder bump 22 or the input/output pins 64 are connected to the upper part of the sixth wiring layer 46. (FIG. 2 shows an example where the solder bump 22 is connected.)

As described above, the solder bump 22 acts as an external connection terminal of the semiconductor chip 62. Also, the input/output pin 64 acts as an external connection terminal for mounting the MCM 60 on a mounting board. Thus, the semiconductor chip 62 and the input/output pin 64 are electrically connected by the solder bump 22 and the multilayer thin-film wiring boards 30.

Now, the second wiring layer 38 of the interlayer connection via 50 of the above structure will be described in detail. In the present embodiment, the second wiring layer 38 is provided with a plurality of branching vias 54 formed therein in an integrated manner. The branching vias 54 are positioned so as to protrude in a direction that the ceramic base 34 extends (in the Figure, the direction indicated by an arrow X).

This branching via 54 includes an arm-like protruding part 56 protruding in the above-described direction and a joining part 58 which protrudes toward the ceramic base 34 at the end part of the protruding part 56. Also, the joining part 58 is joined to the first wiring layer 36, which is the wiring layer closest to the ceramic base 34.

In the present embodiment, the distance L1 between the center of the interlayer connection via 50 and the joining part 58 of the branching via 54 is, for example, approximately 60 $\mu$m. Also, the diameter L2 of each connecting part 58 and the interlayer connection via 50 is approximately 20 $\mu$m. The distance L1 and the diameter L2 are not limited to the above length. It is also possible to choose an appropriate distance and diameter in accordance with the length of the interlayer connection via 50, flexibility of the interlayer insulating layer 48 and strength of the stress applied thereto.

In the following, the branching via 54 will be described in detail. It is assumed that a heating process (e.g., heating process upon mounting) is implemented on the multilayer thin-film wiring board 30. When heat is applied to the multilayer thin-film wiring board 30, a difference in thermal expansion rate occurs between the semiconductor chip 62 and the ceramic base 34. The difference in thermal expansion rate is applied as stress to the interlayer connection via 50 provided between the semiconductor chip 62 and the ceramic base 34.

Figure 1:
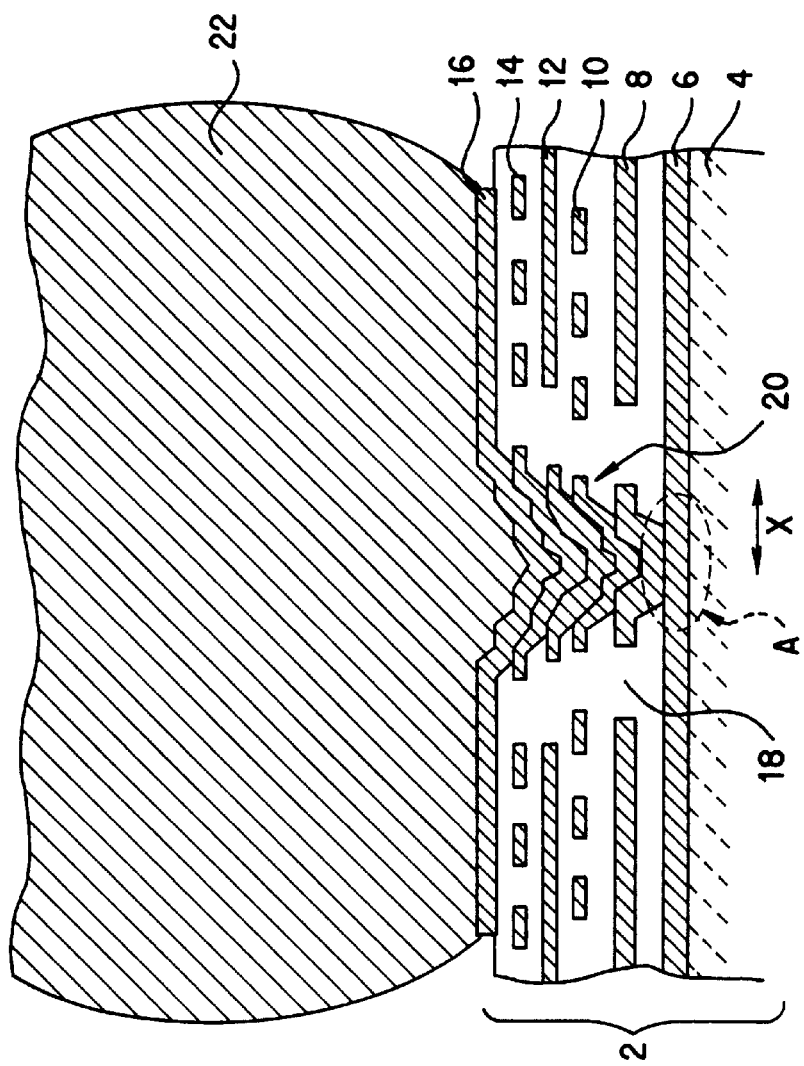
FIG. 1 is an enlarged cross-sectional diagram showing an interlayer connection via provided in a multilayer,thin-film wiring board of the related art.

In the multilayer thin-film wiring board 2 shown in FIG. 1, stress resulting from the difference in thermal expansion rate was totally applied to the interlayer connection via 20. Therefore, as has been described, peeling may occur at position A near the ceramic base 4, that is to say, at a position where the first wiring layer 36 and the second wiring layer 38 are joined together.

The multilayer thin-film wiring board 30 according to the present embodiment includes the second wiring layer 38, which forms the interlayer connection via 50, provided with a plurality of branching vias 54 formed therewith in an integrated manner. Also, the joining part 58 forming the branching via 54 is joined to the first wiring layer 36. Thereby, the second wiring layer 38 is joined to the first wiring layer 36 at a plurality of positions, such as a joining part 38a coaxial with the interlayer connection via 50 and a plurality of joining parts 58 formed at end parts of the protruding parts 56. That is to say, the interlayer connection via 50 is supported by a number of supporting positions.

With the above-described structure, the stress applied to the interlayer connection via 50 will be dispersed to the joining part 38a and each of the joining parts 58. Therefore, the stress applied to individual joining part 38a and 58 will be reduced. This prevents each of the joining parts 38a and 58 from peeling off from the first wiring layer 36 fixed to the ceramic base 34. Accordingly, it is possible to improve the reliability of the multilayer thin-film wiring board 30.

In the present embodiment, the branching via 54 which branches from the interlayer connection via 50 appears in a wiring layer positioned closer to the ceramic base 34, or, at a position close to the ceramic base 34 than the third to fifth wiring layers 40, 42, and 44 (signal wiring layers). With such a structure, the branching via 54 is prevented from disturbing the third to fifth wiring layers 40, 42, and 44 (signal wiring layers). Accordingly, the third to fifth wiring layers 40, 42, and 44 may be positioned in any order.

In the present embodiment, the interlayer connection via 50 and the branching via 54 are joined to the first wiring layer 36 which is closest to the ceramic base 34. Therefore, heat produced in the semiconductor chip 62 can be dissipated through the interlayer connection via 50 and the branching via 54. Accordingly, it is possible to improve efficiency in heat dissipation.

Also in the example shown in FIG. 2, the branching vias 54 protrude to the right and left in the figure, respectively. However, a number of the branching vias 54 is not limited to two and may be of any number.

In the present embodiment, the branching via 54 is constructed so as to extend from the second wiring layer 38. However, the branching via 54 may also extend from other wiring layers 40, 44 and 46.

Further, the present invention is not limited to these embodiments, but variations and modifications may be made without departing from the scope of the present invention.

The present application is based on Japanese priority application No. 09-361166 filed on (Dec. 26, 1997) the entire contents of which are hereby incorporated by reference.

What is claimed is:

1. A multilayer thin-film wiring board comprising a base material provided with a plurality of wiring layers and an insulating layer laminated on said base material, one of said wiring layers overlaying said base material being a ground layer, and comprising an interlayer connection via having a structure such that said wiring layers are laminated so as to be provided through said insulating layer, said plurality of wiring layers being insulated from each other by said insulating layer except at said interlayer connection via, wherein one of the wiring layers placed at a position closest to said ground layer is provided with a plurality of branches forming a plurality of branching vias, said plurality of branching vias extending said interlayer connection via and being placed along a direction of extension of said base material, and wherein said plurality of branching vias are joined to said ground layer and are insulated from an adjacent one of said wiring layers.

2. The multilayer thin-film wiring board as claimed in claim 1, wherein said interlayer connection via is, along with said plurality of branching vias, joined to said ground layer.

3. The multilayer thin-film wiring board as claimed in claim 1, wherein said interlayer connection via is joined to an external connection terminal at an end part which is opposite to said base material.

4. A multilayer thin-film wiring board comprising a base material provided with a plurality of wiring layers and an insulating layer laminated on said base material, the wiring layer overlaying and arranged adjacent said base material being a ground layer, and comprising an interlayer connection via having a structure such that said wiring layers are laminated so as to be provided through said insulating layer, wherein one of the wiring layers placed at a position closest to said ground layer is provided with a plurality of branches forming a plurality of branching vias, said plurality of branching vias being placed along a direction of extension of said base material, and wherein said plurality of branching vias are joined to said ground layer.

* * * * *